(12) United States Patent
Park et al.

(10) Patent No.: US 11,653,083 B2
(45) Date of Patent: May 16, 2023

(54) IMAGE SENSOR MODULE

(71) Applicant: QUALCOMM Incorporated, San Diego, CA (US)

(72) Inventors: Edwin Chongwoo Park, San Diego, CA (US); Ravishankar Sivalingam, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 114 days.

(21) Appl. No.: 17/247,529

(22) Filed: Dec. 15, 2020

(65) Prior Publication Data

US 2022/0191390 A1    Jun. 16, 2022

(51) Int. Cl.
*H04N 5/232*      (2006.01)
*H04N 5/3745*      (2011.01)
*H01L 27/146*      (2006.01)

(52) U.S. Cl.
CPC ... *H04N 5/23219* (2013.01); *H01L 27/14605* (2013.01); *H04N 5/37455* (2013.01); *H01L 27/14621* (2013.01)

(58) Field of Classification Search
CPC ............ H04N 5/23219; H04N 5/37455; H01L 27/14605; H01L 27/14621
See application file for complete search history.

(56) References Cited

U.S. PATENT DOCUMENTS

| | | | |
|---|---|---|---|
| 5,796,095 A | 8/1998 | Matsuyama et al. | |
| 10,109,667 B2 * | 10/2018 | Kusumoto | H01L 29/78648 |
| 10,687,034 B1 * | 6/2020 | Berkovich | H04N 9/083 |
| 2005/0248676 A1 | 11/2005 | Christenson | |
| 2008/0165257 A1 | 7/2008 | Boettiger | |
| 2016/0006969 A1 * | 1/2016 | Matsumoto | H04N 5/37455 348/308 |
| 2016/0119522 A1 * | 4/2016 | Choi | H04N 5/2256 348/302 |
| 2017/0038479 A1 | 2/2017 | Goderer et al. | |
| 2017/0195587 A1 | 7/2017 | Kirsch | |
| 2017/0366762 A1 * | 12/2017 | Hicks | H04N 9/04559 |
| 2018/0220068 A1 | 8/2018 | Guenter | |
| 2018/0231660 A1 | 8/2018 | Deane | |
| 2018/0270436 A1 | 9/2018 | Ivarsson et al. | |
| 2018/0376082 A1 * | 12/2018 | Liu | G01J 1/4228 |

(Continued)

FOREIGN PATENT DOCUMENTS

WO    2020102110 A1    5/2020

OTHER PUBLICATIONS

International Search Report and Written Opinion—PCT/US2021/072030—ISA/EPO—dated Feb. 21, 2022.

*Primary Examiner* — Lin Ye
*Assistant Examiner* — John H Morehead, III
(74) *Attorney, Agent, or Firm* — Qualcomm Incorporated (57) ABSTRACT

Various aspects of the present disclosure generally relate to a sensor module. In some aspects, an image sensor module may include an array of photon sensors configured to output a first set of signals corresponding to a set of photon sensors of the array of photon sensors. The set of photon sensors may include a row of photon sensors, or a column of photon sensors, of the array of photon sensors. The image sensor module may include a plurality of data selector components configured to receive the first set of signals and output a second set of signals corresponding to a subset of the set of photon sensors.

30 Claims, 7 Drawing Sheets

(56) References Cited

U.S. PATENT DOCUMENTS

| | | | |
|---|---|---|---|
| 2018/0376090 A1* | 12/2018 | Liu | H04N 5/378 |
| 2019/0174120 A1* | 6/2019 | Wang | H04N 5/37455 |
| 2019/0197930 A1* | 6/2019 | Kim | G09G 3/3266 |
| 2020/0068189 A1* | 2/2020 | Chen | H04N 13/286 |
| 2020/0128203 A1* | 4/2020 | Hirono | H04N 5/369 |
| 2020/0145593 A1* | 5/2020 | Gao | H04N 5/35527 |
| 2020/0186731 A1* | 6/2020 | Chen | H01L 27/14645 |
| 2020/0412983 A1* | 12/2020 | Nakata | G09G 5/00 |

\* cited by examiner

IMAGE SENSOR MODULE

FIELD OF THE DISCLOSURE

Aspects of the present disclosure generally relate to sensors and, for example, to an image sensor module for a user device.

BACKGROUND

Sensors are used within user devices for various purposes. Such sensors may be used to sense one or more characteristics associated with the user device. Such characteristics may include one or more characteristics of an environment of the user device. For example, one or more sensors may be configured to detect whether a user is present, detect motion, measure ambient lighting, capture images of the environment or the user for analysis, and/or the like. A head-mounted display may include an inward facing image sensor (e.g., a camera) for eye tracking applications. The image sensor may be used to capture image information regarding an eye, and utilize the image information to determine information regarding a position of the eye. For example, the image sensor may be used to determine a gaze direction of the eye.

SUMMARY

In some aspects, an image sensor module includes: an array of photon sensors configured to output a first set of signals corresponding to a set of photon sensors of the array of photon sensors, where the set of photon sensors includes a row of photon sensors, or a column of photon sensors, of the array of photon sensors; and a plurality of data selector components configured to receive the first set of signals and output a second set of signals corresponding to a subset of the set of photon sensors.

In some implementations, a method includes: determining, by a user device, a subset of a set of photon sensors of an array of photon sensors that is to be used for signal acquisition, the set of photon sensors including a row of photon sensors, or a column of photon sensors, of the array of photon sensors, where the array of photon sensors is configured to output a first set of signals corresponding to the set of photon sensors; and causing, by the user device and based at least in part on determining the subset of the set of photon sensors, a plurality of data selector components to receive the first set of signals and output a second set of signals corresponding to the subset of the set of photon sensors.

In some implementations, a non-transitory computer-readable medium storing a set of instructions includes one or more instructions that, when executed by one or more processors of a user device, cause the user device to: determine a subset of a set of photon sensors of an array of photon sensors that is to be used for signal acquisition, the set of photon sensors including a row of photon sensors, or a column of photon sensors, of the array of photon sensors, where the array of photon sensors is configured to output a first set of signals corresponding to the set of photon sensors; and cause, based at least in part on determining the subset of the set of photon sensors, a plurality of data selector components to receive the first set of signals and output a second set of signals corresponding to the subset of the set of photon sensors.

In some implementations, an apparatus includes means for determining a subset of a set of photon sensors of an array of photon sensors that is to be used for signal acquisition, the set of photon sensors including a row of photon sensors, or a column of photon sensors, of the array of photon sensors, where the array of photon sensors is configured to output a first set of signals corresponding to the set of photon sensors; and means for causing, based at least in part on determining the subset of the set of photon sensors, a plurality of data selector components to receive the first set of signals and output a second set of signals corresponding to the subset of the set of photon sensors.

Aspects generally include a method, apparatus, system, computer program product, non-transitory computer-readable medium, user device, user equipment, wireless communication device, and/or processing system as substantially described with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

User devices (e.g., mobile devices, wearable devices, smart eyeglasses, head-mounted display devices, and/or the like) may include one or more cameras to enable the capture of images. A head-mounted display device may include an inward-facing camera for use in eye tracking. Eye tracking may be useful in connection with virtual reality (VR) applications, augmented reality (AR) applications, mixed reality (MR) applications, or the like (which may be referred to collectively as extended reality (XR)). For example, eye movements of a user may be tracked to determine a direction of the user's gaze, which may be used as an input for XR applications.

Head-mounted display devices for XR are designed to accommodate a wide variety of head sizes, eye spacings, pupil distances, or the like. For example, to accommodate variations in pupil-to-pupil distances across a population of users, the inward-facing camera of a head-mounted display device may be configured with a wide field of view to enable eye tracking across the population of users. However, a smaller field of view may be all that is necessary for eye tracking of a particular individual user.

A camera may include an image sensor module that includes an array of photon sensors arranged in rows and columns. Typically, the array of photon sensors is read out one entire row at a time. If less than the entire row is needed (e.g., because the entire field of view of the camera is not needed for eye tracking of an individual user), the pixels of interest may be read out with a separate analog to digital converter (ADC), or the row may be shifted until the pixels of interest are read out. However, because the entire row must be read out in order to obtain the pixels of interest, the use of a portion of a row consumes the same amount of power and time as using the entire row. Thus, head-mounted display devices, that use an inward-facing camera with a wide field of view to accommodate a variety of users, may operate relatively slowly and consume more power and/or processing resources than necessary for eye tracking of an individual user.

Some techniques and apparatuses described herein relate to an image sensor module that provides improved efficiency, particularly when a total field of view of the image sensor module is not being utilized for a particular user or a particular operation. The image sensor module may include an array of photon sensors configured to output a set of signals corresponding to a row of the array. In some aspects, the image sensor module may include one or more data selector components, such as multiplexers, configured to receive the set of signals and output a subset of the set of signals (e.g., when the entire row is not being utilized). For example, the subset of the signals may correspond to a subset of photon sensors of a row of the array. The subset of the signals may be received by one or more ADCs for conversion to a digital domain and further processing (e.g., for use in eye tracking). In this way, an entire row of photon sensors of the array is not read out or reported when only a portion of the row is to be utilized, thereby conserving processing and/or power resources and improving the speed of data transfer and image data acquisition. For example, if the image sensor module uses a single ADC, the entire row may not be transferred to the ADC. As another example, if the image sensor module uses multiple ADCs for columns of the array, the quantity of ADCs may be less than the quantity of photon sensors in the entire row.

Figure 1:
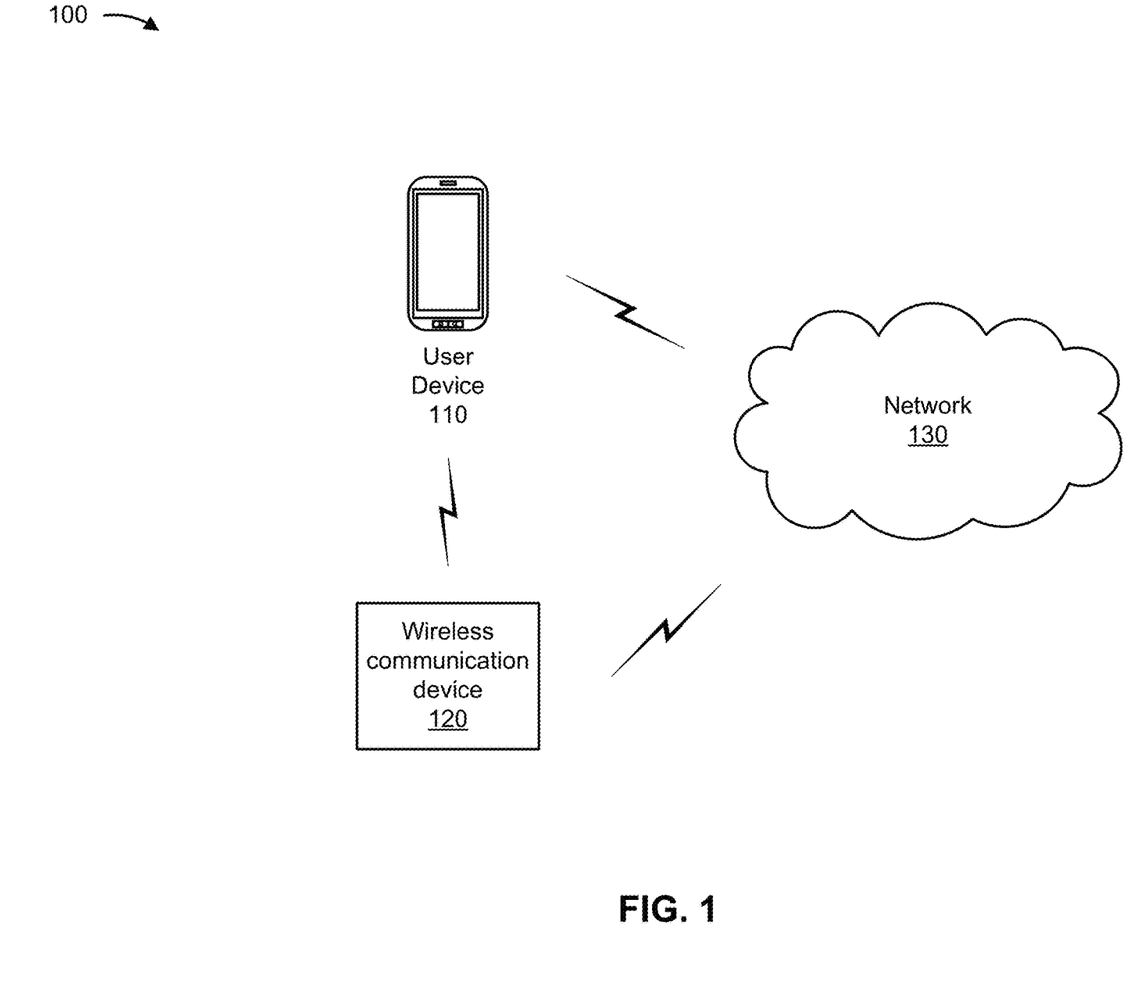
FIG. 1 is a diagram illustrating an example environment in which an image sensor module described herein may be implemented, in accordance with various aspects of the present disclosure.

FIG. 1 is a diagram illustrating an example environment 100 in which an image sensor module described herein may be implemented, in accordance with various aspects of the present disclosure. As shown in FIG. 1, environment 100 may include a user device 110, a wireless communication device 120, and/or a network 130. Devices of environment 100 may interconnect via wired connections, wireless connections, or a combination of wired and wireless connections.

User device 110 includes one or more devices capable of including one or more image sensor modules described herein. For example, user device 110 may include one or more devices capable of receiving, generating, storing, processing, and/or providing information associated with one or more sensors described herein. More specifically, user device 110 may include a communication and/or computing device, such as a user equipment (e.g., a smartphone, a radiotelephone, and/or the like), a laptop computer, a tablet computer, a handheld computer, a desktop computer, a gaming device, a wearable communication device (e.g., a smart wristwatch, a pair of smart eyeglasses, and/or the like), a head-mounted display device (e.g., for use in XR), or a similar type of device. As described herein, user device 110 (and/or an image sensor module of user device 110) may be used to detect, analyze, and/or perform one or more operations associated with eye tracking of a user.

Similar to user device 110, wireless communication device 120 includes one or more devices capable of receiving, generating, storing, processing, and/or providing information associated with one or more sensors described herein. For example, wireless communication device 120 may include a base station, an access point, and/or the like. Additionally, or alternatively, similar to user device 110, wireless communication device 120 may include a communication and/or computing device, such as a mobile phone (e.g., a smart phone, a radiotelephone, and/or the like), a laptop computer, a tablet computer, a handheld computer, a desktop computer, a gaming device, a wearable communication device (e.g., a smart wristwatch, a pair of smart eyeglasses, and/or the like), a head-mounted display device (e.g., for use in XR), or a similar type of device.

Network 130 includes one or more wired and/or wireless networks. For example, network 130 may include a cellular network (e.g., a long-term evolution (LTE) network, a code division multiple access (CDMA) network, a 3G network, a 4G network, a 5G network, another type of next generation network, and/or the like), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks. In some aspects, network 130 may include a data network and/or be communicatively connected with a data platform (e.g., a web-platform, a cloud-based platform, a non-cloud-based platform, and/or the like) that is capable of receiving, generating, processing, and/or providing information associated with eye tracking operations performed by user device 110.

The quantity and arrangement of devices and networks shown in FIG. 1 are provided as one or more examples. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
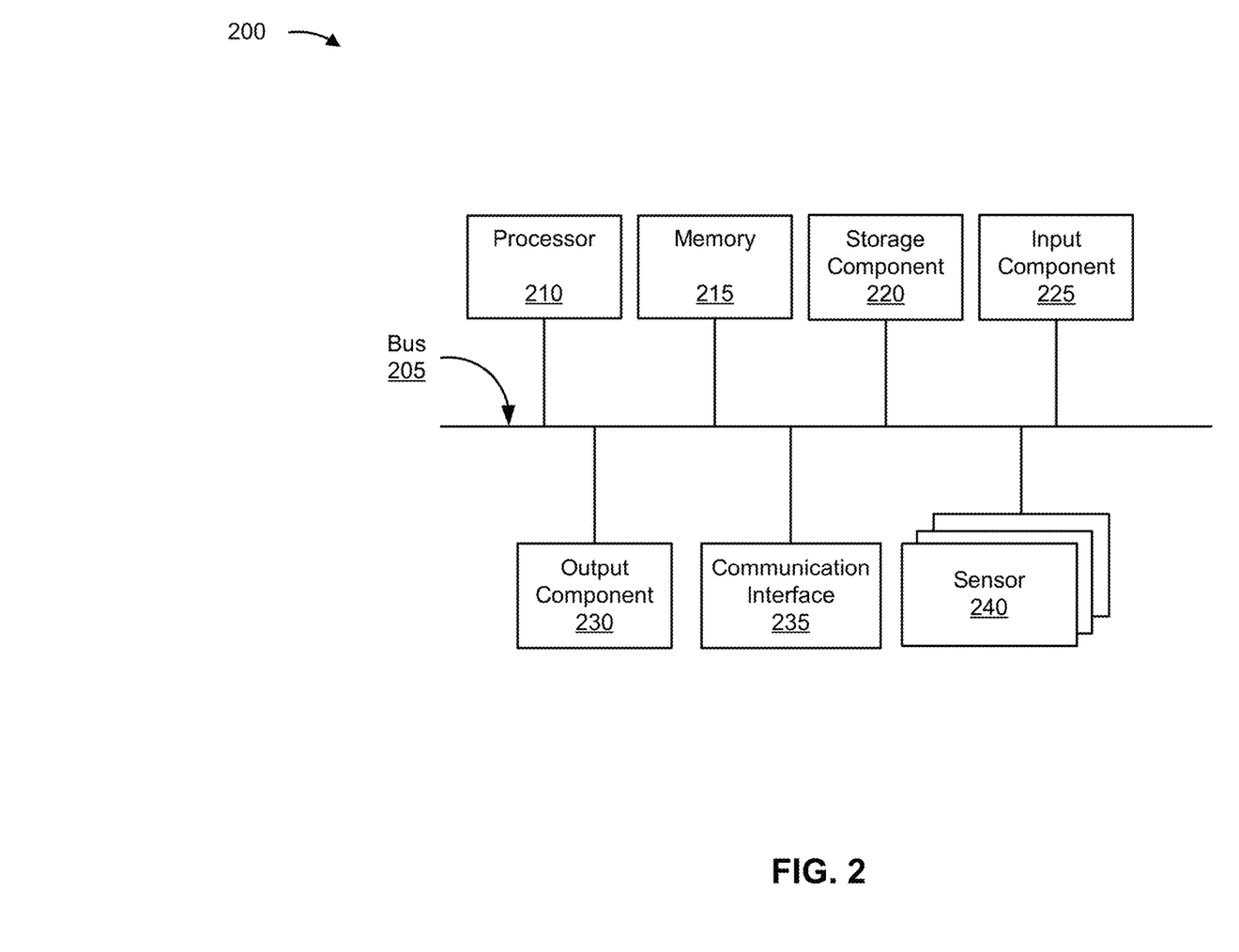
FIG. 2 is a diagram illustrating example components of one or more devices shown in FIG. 1, such as a user device, in accordance with various aspects of the present disclosure.

FIG. 2 is a diagram of example components of a device 200. Device 200 may correspond to user device 110 and/or wireless communication device 120. Additionally, or alternatively, user device 110, and/or wireless communication device 120 may include one or more devices 200 and/or one or more components of device 200. As shown in FIG. 2, device 200 may include a bus 205, a processor 210, a memory 215, a storage component 220, an input component 225, an output component 230, a communication interface 235, and one or more sensors 240.

Bus 205 includes a component that permits communication among the components of device 200. Processor 210 includes a central processing unit (CPU), a graphics processing unit (GPU), an accelerated processing unit (APU), a digital signal processor (DSP), a microprocessor, a microcontroller, a field-programmable gate array (FPGA), an application-specific integrated circuit (ASIC), and/or another type of processing component. Processor 210 is implemented in hardware, firmware, or a combination of hardware and software. In some aspects, processor 210 includes one or more processors capable of being programmed to perform a function.

Memory 215 includes a random-access memory (RAM), a read only memory (ROM), and/or another type of dynamic or static storage device (e.g., a flash memory, a magnetic memory, and/or an optical memory) that stores information and/or instructions for use by processor 210.

Storage component 220 stores information and/or software related to the operation and use of device 200. For example, storage component 220 may include a hard disk (e.g., a magnetic disk, an optical disk, a magneto-optic disk, and/or a solid-state disk), a compact disc (CD), a digital versatile disc (DVD), a floppy disk, a cartridge, a magnetic tape, and/or another type of non-transitory computer-readable medium, along with a corresponding drive.

Input component 225 includes a component that permits device 200 to receive information, such as via user input. For example, input component 225 may be associated with a user interface as described herein (e.g., to permit a user to interact with the one or more features of device 200). Input component 225 may include a touchscreen display, a keyboard, a keypad, a mouse, a button, a switch, a microphone, and/or the like. Additionally, or alternatively, input component 225 may include a sensor for sensing information associated with device 200. More specifically, input component 225 may include a magnetometer (e.g., a Hall effect sensor, an anisotropic magnetoresistive (AMR) sensor, a giant magneto-resistive sensor (GMR), and/or the like), a location sensor (e.g., a global positioning system (GPS) receiver, a local positioning system (LPS) device (e.g., that uses triangulation, multi-lateration, and/or the like), and/or the like), a gyroscope (e.g., a micro-electro-mechanical systems (MEMS) gyroscope or a similar type of device), an accelerometer, a speed sensor, a motion sensor, an infrared sensor, a temperature sensor, a pressure sensor, and/or the like. Output component 230 includes a component that provides output from device 200 (e.g., a display, a speaker, one or more light-emitting diodes (LEDs), and/or the like).

Communication interface 235 includes a transceiver and/or a separate receiver and transmitter that enables device 200 to communicate with other devices, such as via a wired connection, a wireless connection, or a combination of wired and wireless connections. Communication interface 235 may permit device 200 to receive information from another device and/or provide information to another device. For example, communication interface 235 may include an Ethernet interface, an optical interface, a coaxial interface, an infrared interface, a radio frequency (RF) interface, a universal serial bus (USB) interface, a Wi-Fi interface, a cellular network interface, a wireless modem, an inter-integrated circuit ($I^2C$), a serial peripheral interface (SPI), or the like.

Sensor 240 includes one or more devices capable of sensing characteristics associated with an environment of device 200. Sensor 240 may include one or more integrated circuits (e.g., on a packaged silicon die) and/or one or more passive components of one or more flex circuits to enable communication with one or more components of device 200. In some aspects, sensor 240 may include a vision sensor (e.g., an image sensor, an optical sensor, and/or the like), a camera (e.g., a low-resolution camera, a high-resolution camera, and/or the like), and/or the like.

Sensor 240 may include a low-resolution camera (e.g., a video graphics array (VGA)) that is capable of capturing low-resolution images (e.g., images that are less than one megapixel and/or the like). Sensor 240 may be a low-power device (e.g., a device that consumes less than 10 milliwatts (mW) of power) that has always-on capability while device 200 is powered on. In some aspects, sensor 240 may include a charge-coupled device (CCD) sensor or a complementary metal oxide semiconductor (CMOS) sensor.

Device 200 may perform one or more processes described herein. Device 200 may perform these processes in response to processor 210 executing software instructions stored by a non-transitory computer-readable medium, such as memory 215 and/or storage component 220. "Computer-readable medium" as used herein refers to a non-transitory memory device. A memory device includes memory space within a single physical storage device or memory space spread across multiple physical storage devices.

Software instructions may be read into memory 215 and/or storage component 220 from another computer-readable medium or from another device via communication interface 235. When executed, software instructions stored in memory 215 and/or storage component 220 may cause processor 210 to perform one or more processes described herein. Additionally, or alternatively, hardwired circuitry may be used in place of or in combination with software instructions to perform one or more processes described herein. Thus, aspects described herein are not limited to any specific combination of hardware circuitry and software.

In some aspects, device 200 includes means for performing one or more processes described herein and/or means for performing one or more operations of the processes described herein. For example, the means for performing the processes and/or operations described herein may include bus 205, processor 210, memory 215, storage component 220, input component 225, output component 230, communication interface 235, sensor 240, and/or any combination thereof. More specifically, device 200 includes means for determining a subset of a set of photon sensors of an array of photon sensors that is to be used for signal acquisition. In some aspects, the set of photon sensors includes a row of photon sensors, or a column of photon sensors, of the array of photon sensors, and the array of photon sensors is configured to output a first set of signals corresponding to the set of photon sensors. Device 200 may include means for causing, based at least in part on determining the subset of the set of photon sensors, a plurality of data selector components to receive the first set of signals and output a second set of signals corresponding to the subset of the set of photon sensors.

In some aspects, device 200 may include means for determining the subset of the set of photon sensors based at least in part on a location of an eye relative to the array of photon sensors. In some aspects, device 200 may include means for performing data binning of the first set of signals prior to the one or more data selector components receiving the first set of signals or data binning of the second set of signals output by the one or more data selector components. In some aspects, device 200 may include means for causing one or more photon sensors, of the set of photon sensors, that are not to be used for signal acquisition, to receive less power relative to the subset of the set of photon sensors.

The quantity and arrangement of components shown in FIG. 2 are provided as an example. In practice, device 200 may include additional components, fewer components, different components, or differently arranged components than those shown in FIG. 2. Additionally, or alternatively, a set of components (e.g., one or more components) of device 200 may perform one or more functions described as being performed by another set of components of device 200.

Figure 3:
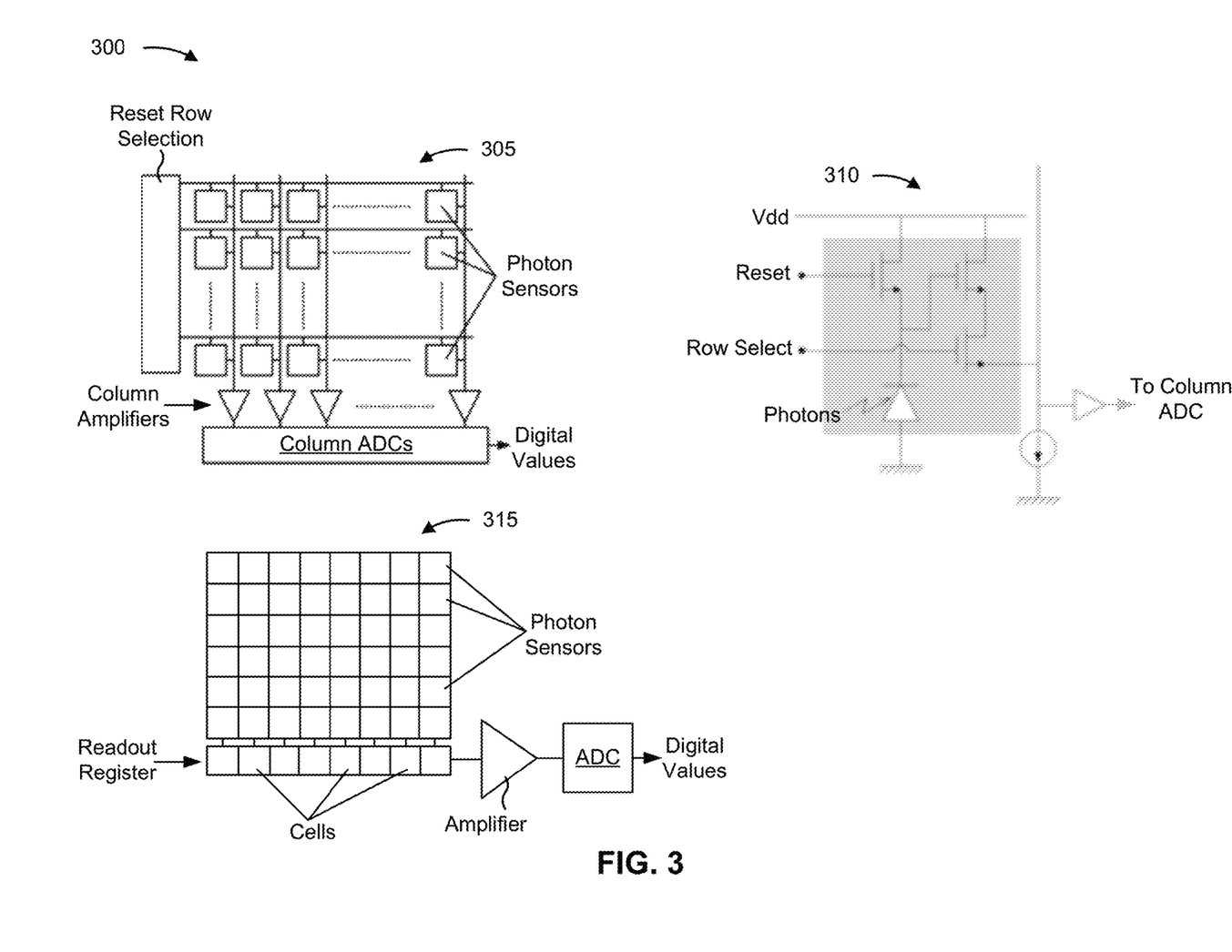
FIG. 3 is a diagram illustrating an example of image sensor modules, in accordance with various aspects of the present disclosure.

FIG. 3 is a diagram illustrating an example 300 of image sensor modules, in accordance with various aspects of the present disclosure. FIG. 3 shows an example image sensor module 305. The image sensor module 305 may include a CMOS sensor. The image sensor module 305 may include an array of photon sensors arranged into rows and columns, and each column of photon sensors may provide signals to a respective ADC (shown in a Column ADC row) for conversion to digital values. In some aspects, photon sensor 310 may be used in the image sensor module 305. The photon sensor 310 may be a CMOS photon sensor.

FIG. 3 also shows an example image sensor module 315. The image sensor module 315 may include a CCD sensor. As above, the image sensor module 315 may include an array of photon sensors arranged into rows and columns. Here, each column of photon sensors may provide signals to a respective cell of a readout register (e.g., a horizontal shift register). The readout register may provide the signals, via horizontal shifting of the signals one-by-one, to a single (e.g., global) ADC for conversion to digital values.

In some aspects, the image sensor module described herein may employ a CMOS-based architecture (e.g., exemplified by the image sensor module 305) or a CCD-based architecture (e.g., exemplified by the image sensor module 315).

As indicated above, FIG. 3 is provided as an example. Other examples may differ from what is described with respect to FIG. 3.

Figure 4A:
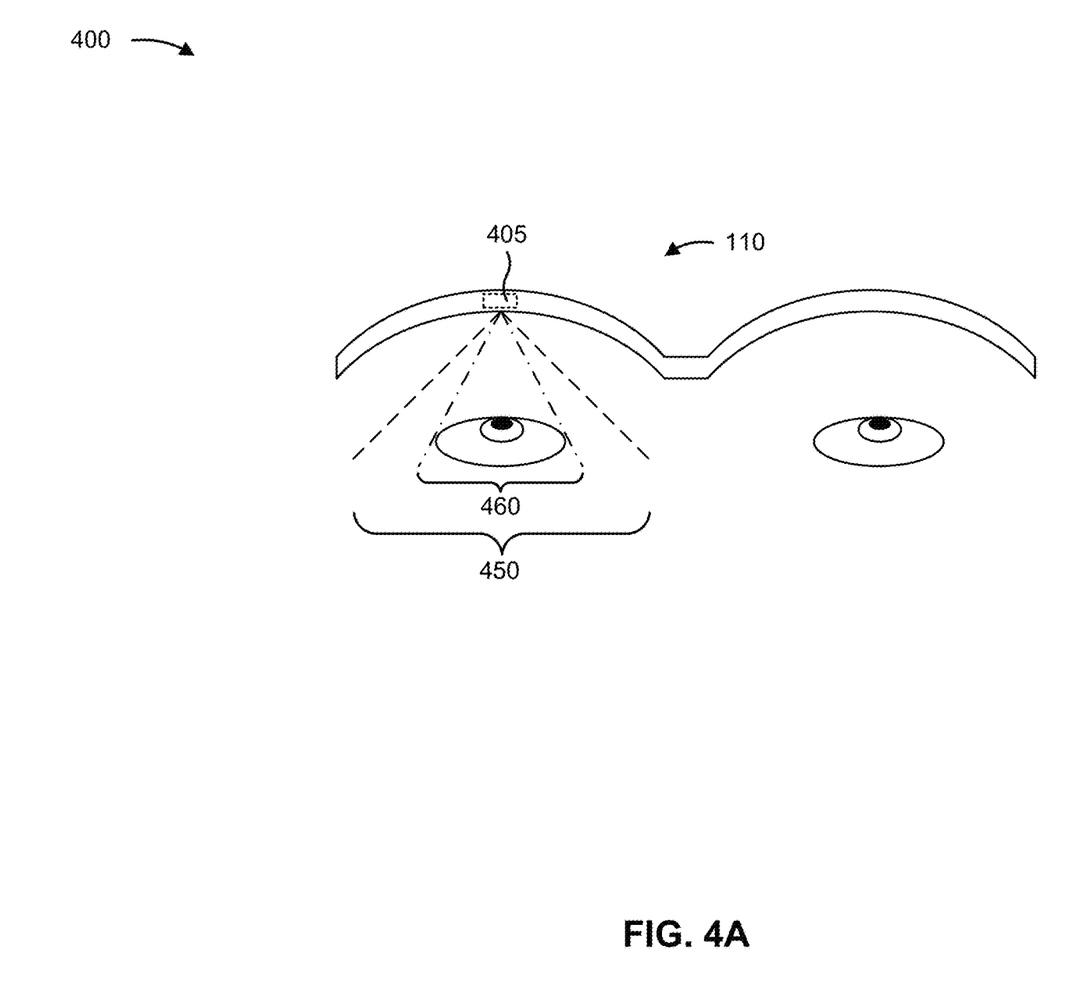
FIGS. 4A-4C are diagrams illustrating an example associated with an image sensor module, in accordance with various aspects of the present disclosure.
Figure 4B:
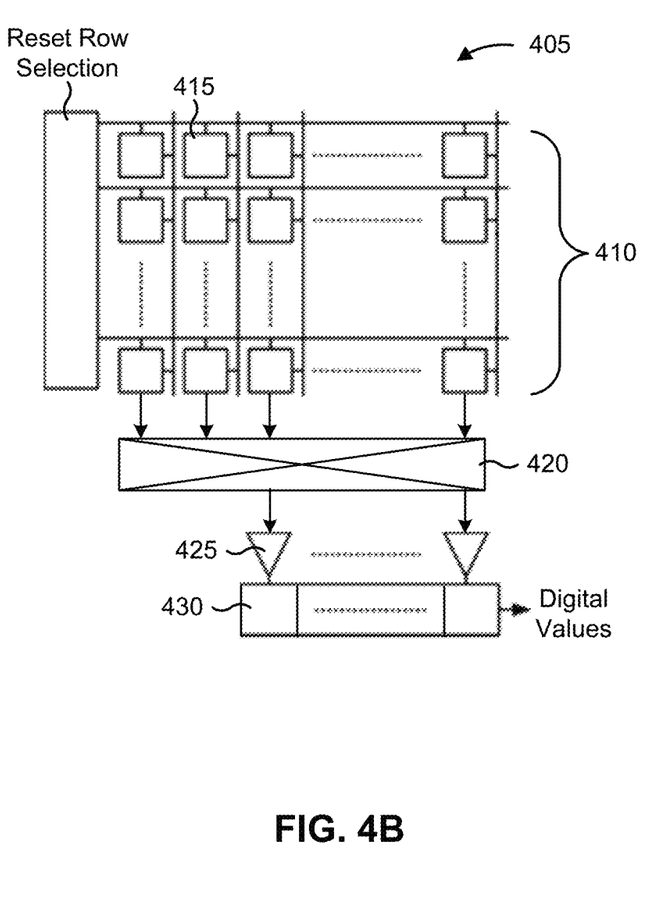
Figure 4C:
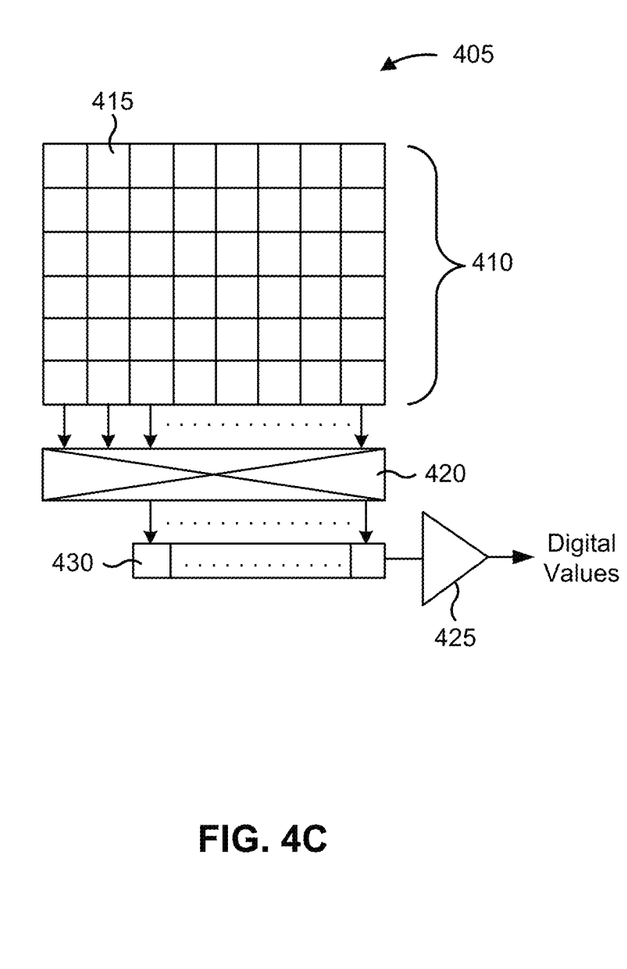

FIGS. 4A-4C are diagrams of an example 400 associated with an image sensor module, in accordance with various aspects of the present disclosure. As shown in FIG. 4A, example 400 includes a user device 110, which is described in more detail above in connection with FIGS. 1-2. In example 400, the user device 110 is depicted as a head-mounted display device (shown from above) that is worn in front of at least one eye of a user, for example, for XR applications; however, the user device 110 may be a user equipment or a wearable communication device, among other examples. In some aspects, the user device 110 may be associated with non-XR applications. For example, the user device 110 may be an Internet of Things (IoT) device, such as a smart speaker, a smart camera, or the like.

The user device 110 includes one or more image sensor modules 405. The image sensor module 405 may include a controller (e.g., processor 210), or may be in communication with a controller of the user device 110. An image sensor module 405 may be, or may be associated with, a camera of the user device 110. In some aspects, the camera is an inward-facing camera used, for example, for eye tracking of a user. For example, a head-mounted display device, a pair of smart eyeglasses, or the like, may include a first inward-facing camera at a left side for tracking a left eye of a user, and a second inward-facing camera at a right side for tracking a right eye of the user. In some aspects, the camera is an outward-facing camera used, for example, for position tracking of a user or capturing other objects or areas of interest.

The image sensor module 405 may have a full field of view 450. The full field of view 450 may be relatively wide to accommodate a variety of views (e.g., to accommodate a variety of eye spacings and/or pupil distances across a population of potential users of the user device 110). As shown, only a partial field of view 460 (e.g., a portion of the full field of view 450) may be needed when the user device 110 is used in connection with a particular user and/or a particular operation (e.g., eye tracking of a particular user).

FIG. 4B shows an example of the image sensor module 405. As shown in FIG. 4B, the image sensor module 405 may include an array 410 of photon sensors 415. A photon sensor 415 may also be referred to as a photodiode, a photosite, or a pixel, among other examples. The photon sensors 415 of the array 410 may be arranged into one or more rows and one or more columns. In some aspects, the array 410 may have a 4:3 aspect ratio or a 4:1 aspect ratio. In some aspects, sizes of the photon sensors 415 of the array 410 may be non-uniform when the image sensor module 405 employs one or more data selector components 420, as described below. Thus, photon sensors 415 of the array 410 that are further from a center of a row may be wider than photon sensors 415 of the array 410 that are nearer to the center of the row (e.g., to improve the conversion of photons to electrons for photon sensors 415 at edges of the array 410).

The photon sensors 415 of the array 410 may be configured to output a set of signals corresponding to a row of photon sensors 415 (i.e., a complete row of photon sensors 415 spanning from a first column to a last column of the array 410). A row of photon sensors 415 of the array 410 may be associated with the full field of view 450 (e.g., horizontal field of view) of the image sensor module 405. The set of signals may correspond to a row of photon sensors 415 in the configuration of the image sensor module 405 shown in FIGS. 4A-4C in which signals are read out in row-based frames. In some aspects, the set of signals may correspond to a column of photon sensors 415 (e.g., corresponding to a full vertical field of view of the image sensor module 405) if the image sensor module 405 is configured so that signals are read out in column-based frames. While the description herein is described in terms of a configuration that uses row-based frames, the description herein applies equally to a configuration that uses column-based frames (e.g., by reversing column/row terminology and horizontal/vertical terminology in the description).

As shown in FIG. 4B, the image sensor module 405 may include one or more (e.g., a plurality of) data selector components 420. The one or more data selector components 420 may include one or more multiplexers, one or more logic gates, and/or one or more filters, among other examples. The one or more data selector components 420 may be configured to receive the set of signals corresponding to a row of photon sensors 415 and output a subset of the set of signals that corresponds to a subset of photon sensors 415 of the row (e.g., a subset of photon sensors 415 spanning a quantity of columns that is less than a total quantity of columns of the array 410). The subset of photon sensors 415 may be associated with the partial field of view 460 (e.g., a portion of the full field of view 450) of the image sensor module 405. For example, the partial field of view 460 may align with a location of a user's eye or pupil.

In some aspects, the image sensor module 405 may include a plurality of data selector components 420 that are arranged in a hierarchy (e.g., with at least two levels of the data selector components 420). In some aspects, the image sensor module 405 may include a single data selector component 420, and the data selector component 420 may include a quantity of inputs corresponding to a quantity of columns in the array 410. In some aspects, the image sensor module 405 may include a plurality of data selector components 420, and the plurality of data selector components may include a quantity of inputs (e.g., in a first level of data selector components 420 when arranged in a hierarchy) corresponding to a quantity of columns in the array 410. The plurality of data selector components 420 may be grouped into multiple sets that define a precision of the partial field of view 460 (e.g., that is further defined by any additional shifting of the signals). For example, increasing the quantity of sets may increase the precision of the partial field of view 460 (e.g., so that the partial field of view 460 may be closely tailored to the size of a user's eye or pupil).

In some aspects, the user device 110 (e.g., a controller of the user device 110 or the image sensor module 405) may determine a particular subset of photon sensors 415 of a row that is to be used for signal acquisition (e.g., that is to be used to obtain the subset of the signals). For example, the user device 110 may determine the particular subset of photon sensors 415 based at least in part on a location of a user's eye or pupil relative to the array 410 (e.g., for inward-facing applications when the user device 110 is worn on the head of the user), based at least in part on a location of one or more objects or areas in a user's environment relative to the array 410 (e.g., for outward-facing applications when the user device 110 is worn on the head of the user), and/or based at least in part on a location of one or more objects or areas in an environment of the user device 110 relative to the array 410 (e.g., for an IoT device or sensor that uses a partial field of view to capture an object, a person, or an area), among other examples.

In some aspects, the user device 110 may cycle through multiple partial fields of view (e.g., portions of the full field of view 450) to determine a particular field of view to use for a particular user or a particular operation. In some aspects, the user device 110 may address (e.g., configure) different inputs of the one or more data selector components 420, different data selector components 420, and/or different sets of data selector components 420, to determine the particular subset of photon sensors 415. For example, the user device 110 may perform an analysis of different subsets of the signals obtained by addressing different inputs/data selector components 420/sets of data selector components 420, and select a particular subset of photon sensors 415 corresponding to the subset of the signals that best capture an object or area of interest, such as a user's eye or pupil, a person, or an object or area in an environment of a user or the user device 110, among other examples. For example, this may be the subset of the signals that includes a highest percentage of pixels associated with the object or area of interest, such as the user's eye or pupil.

In some aspects, the user device 110 (e.g., a controller of the user device 110 or the image sensor module 405) may cause the data selector component(s) 420 to receive the set of signals corresponding to a row of the array 410, and to output the subset of the signals corresponding to the subset of photon sensors 415 of the row. For example, the user device 110 may cause the data selector component(s) 420 to output the subset of the signals based at least in part on determining the particular subset of photon sensors 415 that is to be used for signal acquisition, as described above. In some aspects, the user device 110 may provide one or more control signals (e.g., based at least in part on determining the particular subset of photon sensors 415) to the data selector component(s) 420 to cause the data selector component(s) 420 to output the subset of the signals.

In some aspects, the user device 110 (e.g., a controller of the user device 110 or the image sensor module 405) may cause one or more photon sensors 415 that are not in the subset of photon sensors 415, and therefore are not to be used for signal acquisition, to operate in a power saving mode relative to photon sensors 415 that are in the subset. For example, the user device 110 may cause the one or more photon sensors 415 that are not in the subset to receive less power or consume less power relative to the photon sensors 415 that are in the subset. For example, the one or more photon sensors 415 that are not in the subset may be turned off. In some aspects, different levels of power saving modes may be used among the one or more photon sensors 415 that are not in the subset. For example, photon sensors 415 that are nearer to the portion of a row that encompasses the subset of photon sensors 415 may receive relatively more power than photon sensors 415 that are further from this portion of the row.

In some aspects, the user device 110 (e.g., a controller of the user device 110 or the image sensor module 405) may perform data binning on the set of signals prior to the set of signals being received at the data selector component(s) 420. In some aspects, the user device 110 (e.g., a controller of the user device 110 or the image sensor module 405) may perform data binning on the subset of the signals output by the data selector component(s) 420. This may enable reduced processing of image data obtained by the image sensor module 405.

As shown in FIG. 4B, the image sensor module 405 may include one or more (e.g., a plurality of) ADCs 425. The one or more ADCs 425 may be configured to receive the subset of the signals, corresponding to a subset of photon sensors 415 of a row of the array 410, output by the data selector component(s) 420. The one or more ADCs 425 may be configured to convert the subset of the signals to digital values, which may be used by the user device 110 for further processing, analysis, image generation, eye tracking, or the like. In some aspects, the image sensor module 405 may include one or more amplifiers configured to amplify the subset of the signals prior to the subset of the signals being received at the one or more ADCs 425 (e.g., the quantity of amplifiers may be the same as the quantity of the ADCs 425). In some aspects, the image sensor module 405 may include a readout register 430 configured to receive an output of the one or more ADCs 425.

In some aspects (e.g., for a CMOS sensor), a quantity of the one or more ADCs 425 is less than a quantity of photon sensors 415 in a row of photon sensors 415 of the array 410. For example, the image sensor module 405 may include a plurality of ADCs 425 that are respectively associated with columns for the subset of photon sensors 415 of a row. That is, the quantity of the one or more ADCs 425 may be the same as the quantity of columns for the subset of photon sensors 415 of a row. In this way, the image sensor module 405 may include relatively fewer ADCs, thereby reducing a size of the image sensor module 405.

In some aspects, the user device 110 may perform one or more operations using the image data obtained by the image sensor module 405. That is, the user device 110 may perform the one or more operations using the digital values output by the one or more ADCs 425. The one or more operations may include operations associated with analysis of the image data, image generation using the image data, eye tracking using the image data, or the like.

FIG. 4C shows an example of the image sensor module 405. As shown in FIG. 4C, the image sensor module 405 may include an array 410 of photon sensors 415 and one or more (e.g., a plurality of) data selector components 420, as described above in FIG. 4B.

In some aspects (e.g., for a CCD sensor), the image sensor module 405 may include a readout register 430 (e.g., a horizontal shift register), as described above. The readout register 430 may include a plurality of cells configured to receive the subset of the signals output by the data selector component(s) 420. Here, the image sensor module 405 may include a single (e.g., global) ADC 425 configured to receive the subset of the signals from the readout register 430 (e.g., via horizontal shifting of the readout register). In addition, the image sensor module 405 may include an amplifier configured to amplify the subset of the signals prior to the subset of the signals being received at the ADC 425.

In some aspects (e.g., for a CCD sensor), a quantity of cells in the readout register 430 is less than a quantity of photon sensors 415 in a row of photon sensors 415 of the array 410 (e.g., the entire row is not transferred to the readout register 430). For example, the image sensor module 405 may include a plurality of cells in the readout register 430 that are respectively associated with columns for the subset of photon sensors 415 of a row. That is, the quantity of cells in the readout register 430 may be the same as the quantity of columns for the subset of photon sensors 415 of a row. In this way, the image sensor module 405 may include a relatively smaller readout register 430, thereby reducing a size of the image sensor module 405.

As indicated above, FIGS. 4A-4C are provided as an example. Other examples may differ from what is described with regard to FIGS. 4A-4C. The quantity and arrangement of devices shown in FIGS. 4A-4C are provided as an example. In practice, there may be additional devices, fewer devices, different devices, or differently arranged devices than those shown in FIGS. 4A-4C. Furthermore, two or more devices shown in FIGS. 4A-4C may be implemented within a single device, or a single device shown in FIGS. 4A-4C may be implemented as multiple, distributed devices. Additionally, or alternatively, a set of devices (e.g., one or more devices) shown in FIGS. 4A-4C may perform one or more functions described as being performed by another set of devices shown in FIGS. 4A-4C.

Figure 5:
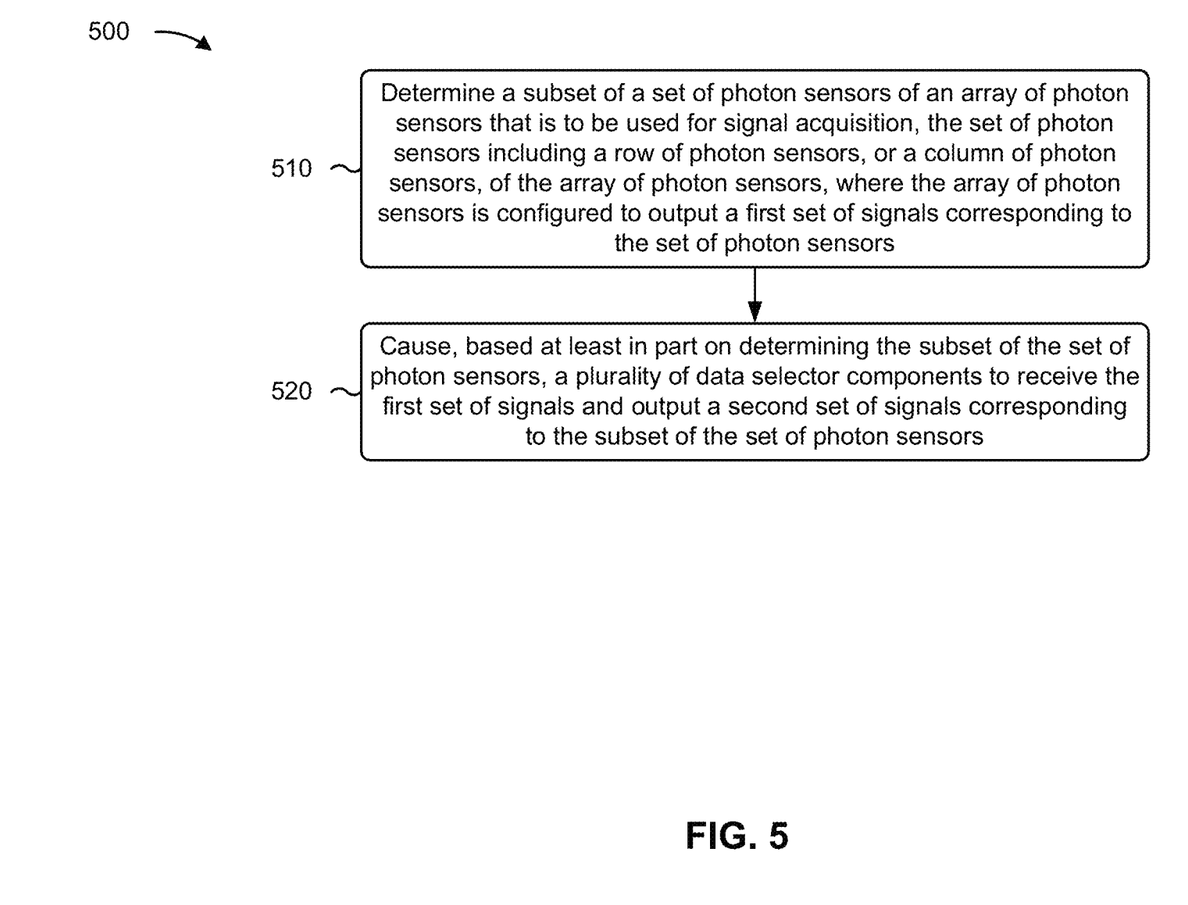
FIG. 5 is a flowchart of an example process associated with an image sensor module, in accordance with various aspects of the present disclosure.

FIG. 5 is a flowchart of an example process 500 associated with an image sensor module. In some aspects, one or more process blocks of FIG. 5 may be performed by a user device (e.g., user device 110). In some aspects, one or more process blocks of FIG. 5 may be performed by another device or a group of devices separate from or including the user device, such as a wireless communication device (e.g., wireless communication device 120) and/or an image sensor module (e.g., image sensor module 405). Additionally, or alternatively, one or more process blocks of FIG. 5 may be performed by one or more components of device 200, such as processor 210, memory 215, storage component 220, input component 225, output component 230, communication interface 235, and/or sensor 240.

As shown in FIG. 5, process 500 may include determining a subset of a set of photon sensors of an array of photon sensors that is to be used for signal acquisition, the set of photon sensors including a row of photon sensors, or a column of photon sensors, of the array of photon sensors, where the array of photon sensors is configured to output a first set of signals corresponding to the set of photon sensors (block 510). For example, the user device (e.g., using processor 210, memory 215, and/or sensor 240) may determine a subset of a set of photon sensors of an array of photon sensors that is to be used for signal acquisition, as described above. In some aspects, the set of photon sensors includes a row of photon sensors, or a column of photon sensors, of the array of photon sensors. In some aspects, the array of photon sensors is configured to output a first set of signals corresponding to the set of photon sensors.

As further shown in FIG. 5, process 500 may include causing, based at least in part on determining the subset of the set of photon sensors, a plurality of data selector components to receive the first set of signals and output a second set of signals corresponding to the subset of the set of photon sensors (block 520). For example, the user device (e.g., using processor 210 and/or memory 215) may cause, based at least in part on determining the subset of the set of photon sensors, a plurality of data selector components to receive the first set of signals and output a second set of signals corresponding to the subset of the set of photon sensors, as described above.

Process 500 may include additional aspects, such as any single aspect or any combination of aspects described below and/or in connection with one or more other processes described elsewhere herein.

In a first aspect, the plurality of data selector components are to output the second set of signals to one or more ADCs.

In a second aspect, alone or in combination with the first aspect, a quantity of the one or more ADCs is less than a quantity of photon sensors in the set of photon sensors.

In a third aspect, alone or in combination with one or more of the first and second aspects, the plurality of data selector components are to output the second set of signals to a plurality of cells of a readout register that are configured to output a signal to a single ADC.

In a fourth aspect, alone or in combination with one or more of the first through third aspects, a quantity of the plurality of cells is less than a quantity of photon sensors in the set of photon sensors.

In a fifth aspect, alone or in combination with one or more of the first through fourth aspects, the plurality of data selector components include a plurality of multiplexers.

In a sixth aspect, alone or in combination with one or more of the first through fifth aspects, the plurality of data selector components are in a hierarchy.

In a seventh aspect, alone or in combination with one or more of the first through sixth aspects, one or more first photon sensors further from a center of the row of photon sensors are wider than one or more second photon sensors nearer to the center of the row of photon sensors.

In an eighth aspect, alone or in combination with one or more of the first through seventh aspects, process 500 includes determining the subset of the set of photon sensors based at least in part on a location of an eye relative to the array of photon sensors.

In a ninth aspect, alone or in combination with one or more of the first through eighth aspects, process 500 includes performing data binning of the first set of signals prior to the plurality of data selector components receiving the first set of signals or data binning of the second set of signals output by the plurality of data selector components.

In a tenth aspect, alone or in combination with one or more of the first through ninth aspects, process 500 includes causing one or more photon sensors, of the set of photon sensors, that are not to be used for signal acquisition, to receive less power relative to the subset of the set of photon sensors.

In an eleventh aspect, alone or in combination with one or more of the first through tenth aspects, the array of photon sensors is included in an inward-facing camera for eye tracking of the user device.

Although FIG. 5 shows example blocks of process 500, in some aspects, process 500 may include additional blocks, fewer blocks, different blocks, or differently arranged blocks than those depicted in FIG. 5. Additionally, or alternatively, two or more of the blocks of process 500 may be performed in parallel.

The following provides an overview of aspects of the present disclosure:

Aspect 1: A method, comprising: determining, by a user device, a subset of a set of photon sensors of an array of photon sensors that is to be used for signal acquisition, the set of photon sensors including a row of photon sensors, or a column of photon sensors, of the array of photon sensors, wherein the array of photon sensors is configured to output a first set of signals corresponding to the set of photon sensors; and causing, by the user device and based at least in part on determining the subset of the set of photon sensors, a plurality of data selector components to receive the first set of signals and output a second set of signals corresponding to the subset of the set of photon sensors.

Aspect 2: The method of aspect 1, wherein the plurality of data selector components are to output the second set of signals to one or more analog to digital converters.

Aspect 3: The method of aspect 2, wherein a quantity of the one or more analog to digital converters is less than a quantity of photon sensors in the set of photon sensors.

Aspect 4: The method of aspect 1, wherein the plurality of data selector components are to output the second set of signals to a plurality of cells of a readout register that are configured to output a signal to a single analog to digital converter.

Aspect 5: The method of aspect 4, wherein a quantity of the plurality of cells is less than a quantity of photon sensors in the set of photon sensors.

Aspect 6: The method of any of aspects 1-5, wherein the plurality of data selector components comprise a plurality of multiplexers.

Aspect 7: The method of any of aspects 1-6, wherein the plurality of data selector components are in a hierarchy.

Aspect 8: The method of any of aspects 1-7, wherein one or more first photon sensors further from a center of the row of photon sensors are wider than one or more second photon sensors nearer to the center of the row of photon sensors.

Aspect 9: The method of any of aspects 1-8, further comprising: determining the subset of the set of photon sensors based at least in part on a location of an eye relative to the array of photon sensors.

Aspect 10: The method of any of aspects 1-9, further comprising: performing data binning of the first set of signals prior to the plurality of data selector components receiving the first set of signals or data binning of the second set of signals output by the plurality of data selector components.

Aspect 11: The method of any of aspects 1-10, further comprising: causing one or more photon sensors, of the set of photon sensors, that are not to be used for signal acquisition, to receive less power relative to the subset of the set of photon sensors.

Aspect 12: The method of any of aspects 1-11, wherein the array of photon sensors is included in an inward-facing camera for eye tracking of the user device.

Aspect 13: An apparatus, comprising a processor; memory coupled with the processor; and instructions stored in the memory and executable by the processor to cause the apparatus to perform the method of one or more aspects of aspects 1-12.

Aspect 14: A device, comprising a memory and one or more processors coupled to the memory, the memory and the one or more processors configured to perform the method of one or more aspects of aspects 1-12.

Aspect 15: An apparatus, comprising at least one means for performing the method of one or more aspects of aspects 1-12.

Aspect 16: A non-transitory computer-readable medium storing code, the code comprising instructions executable by a processor to perform the method of one or more aspects of aspects 1-12.

Aspect 17: A non-transitory computer-readable medium storing a set of instructions, the set of instructions comprising one or more instructions that, when executed by one or more processors of a device, cause the device to perform the method of one or more aspects of aspects 1-12.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, and/or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An image sensor module, comprising:
    an array of photon sensors configured to output a first set of signals corresponding to a set of photon sensors of the array of photon sensors,
        wherein the set of photon sensors includes a section of photon sensors of the array of photon sensors, and
        wherein one or more first photon sensors further from a center of the section of photon sensors are wider than one or more second photon sensors nearer to the center of the section of photon sensors; and
    a plurality of data selector components configured to receive the first set of signals and output a second set of signals corresponding to a subset of the set of photon sensors.

2. The image sensor module of claim 1, further comprising:
    one or more analog to digital converters configured to receive the second set of signals.

3. The image sensor module of claim 2, wherein a quantity of the one or more analog to digital converters is less than a quantity of photon sensors in the set of photon sensors.

4. The image sensor module of claim 1, further comprising:
    a readout register that includes a plurality of cells configured to receive the second set of signals; and
    a single analog to digital converter configured to receive an output of the plurality of cells.

5. The image sensor module of claim 4, wherein a quantity of the plurality of cells is less than a quantity of photon sensors in the set of photon sensors.

6. The image sensor module of claim 1, wherein the plurality of data selector components comprise a plurality of multiplexers.

7. The image sensor module of claim 1, wherein the plurality of data selector components are in a hierarchy.

8. The image sensor module of claim 1, wherein the image sensor module is included in an inward-facing camera for eye tracking.

9. The image sensor module of claim 1, wherein the section of photo sensors is a row of the array of photon sensors.

10. A method, comprising:
    determining, by a user device, a subset of a set of photon sensors of an array of photon sensors that is to be used for signal acquisition, the set of photon sensors including a section of photon sensors of the array of photon sensors,
        wherein one or more first photon sensors further from a center of the section of photon sensors are wider than one or more second photon sensors nearer to the center of the section of photon sensors, and
        wherein the array of photon sensors is configured to output a first set of signals corresponding to the set of photon sensors; and
    causing, by the user device and based at least in part on determining the subset of the set of photon sensors, a plurality of data selector components to receive the first set of signals and output a second set of signals corresponding to the subset of the set of photon sensors.

11. The method of claim 10, wherein the plurality of data selector components are to output the second set of signals to one or more analog to digital converters.

12. The method of claim 11, wherein a quantity of the one or more analog to digital converters is less than a quantity of photon sensors in the set of photon sensors.

13. The method of claim 10, wherein the plurality of data selector components are to output the second set of signals to a plurality of cells of a readout register that are configured to output a signal to a single analog to digital converter.

14. The method of claim 13, wherein a quantity of the plurality of cells is less than a quantity of photon sensors in the set of photon sensors.

15. The method of claim 10, wherein the plurality of data selector components comprise a plurality of multiplexers.

16. The method of claim 10, wherein the plurality of data selector components are in a hierarchy.

17. The method of claim 10, further comprising:
    determining the subset of the set of photon sensors based at least in part on a location of an eye relative to the array of photon sensors.

18. The method of claim 10, further comprising:
    performing data binning of the first set of signals prior to the plurality of data selector components receiving the first set of signals or data binning of the second set of signals output by the plurality of data selector components.

19. The method of claim 10, further comprising:
causing one or more photon sensors, of the set of photon sensors, that are not to be used for signal acquisition, to receive less power relative to the subset of the set of photon sensors.

20. The method of claim 10, wherein the array of photon sensors is included in an inward-facing camera for eye tracking of the user device.

21. The method of claim 10, wherein the section of photo sensors is a row of the array of photon sensors.

22. A non-transitory computer-readable medium storing a set of instructions, the set of instructions comprising:
one or more instructions that, when executed by one or more processors of a user device, cause the user device to:
determine a subset of a set of photon sensors of an array of photon sensors that is to be used for signal acquisition, the set of photon sensors including a section of photon sensors of the array of photon sensors,
wherein one or more first photon sensors further from a center of the section of photon sensors are wider than one or more second photon sensors nearer to the center of the section of photon sensors, and
wherein the array of photon sensors is configured to output a first set of signals corresponding to the set of photon sensors; and
cause, based at least in part on determining the subset of the set of photon sensors, a plurality of data selector components to receive the first set of signals and output a second set of signals corresponding to the subset of the set of photon sensors.

23. The non-transitory computer-readable medium of claim 22, wherein the plurality of data selector components are to output the second set of signals to one or more analog to digital converters.

24. The non-transitory computer-readable medium of claim 23, wherein a quantity of the one or more analog to digital converters is less than a quantity of photon sensors in the set of photon sensors.

25. The non-transitory computer-readable medium of claim 22, wherein the plurality of data selector components are to output the second set of signals to a plurality of cells of a readout register that are configured to output a signal to a single analog to digital converter.

26. The non-transitory computer-readable medium of claim 25, wherein a quantity of the plurality of cells is less than a quantity of photon sensors in the set of photon sensors.

27. An apparatus, comprising:
means for determining a subset of a set of photon sensors of an array of photon sensors that is to be used for signal acquisition, the set of photon sensors including a section of photon sensors of the array of photon sensors,
wherein one or more first photon sensors further from a center of the section of photon sensors are wider than one or more second photon sensors nearer to the center of the section of photon sensors, and
wherein the array of photon sensors is configured to output a first set of signals corresponding to the set of photon sensors; and
means for causing, based at least in part on determining the subset of the set of photon sensors, a plurality of data selector components to receive the first set of signals and output a second set of signals corresponding to the subset of the set of photon sensors.

28. The apparatus of claim 27, wherein the plurality of data selector components are to output the second set of signals to one or more analog to digital converters.

29. The apparatus of claim 28, wherein a quantity of the one or more analog to digital converters is less than a quantity of photon sensors in the set of photon sensors.

30. The apparatus of claim 27, wherein the plurality of data selector components are to output the second set of signals to a plurality of cells of a readout register that are configured to output a signal to a single analog to digital converter.

* * * * *